United States Patent [19]
Elder

[11] Patent Number: 5,659,546
[45] Date of Patent: Aug. 19, 1997

[54] WIDEBAND FREQUENCY SIGNAL DIGITIZER AND METHOD

[76] Inventor: Robert C. Elder, 3008 S. Riverside Dr., McHenry, Ill. 60050

[21] Appl. No.: 619,193

[22] Filed: Mar. 21, 1996

Related U.S. Application Data

[63] Continuation of Ser. No. 366,205, Dec. 29, 1994, abandoned.

[51] Int. Cl.[6] .................................................. H04J 1/05
[52] U.S. Cl. .......................... 370/343; 370/481; 370/484; 370/497
[58] Field of Search ........................... 370/69.1, 120, 370/123, 70, 343, 344, 480, 481, 484, 497; 329/327, 363; 364/724.01, 724.1, 724.13

[56] References Cited

U.S. PATENT DOCUMENTS

| | | | |
|---|---|---|---|
| 3,991,277 | 11/1976 | Hirata | 179/15 |
| 4,101,738 | 7/1978 | Bellanger et al. | 179/15 |
| 4,112,374 | 9/1978 | Steinbrecher | 325/446 |
| 4,206,320 | 6/1980 | Keasler et al. | 179/2 |
| 4,230,956 | 10/1980 | Steinbrecher | 307/257 |
| 4,237,551 | 12/1980 | Narasimha | 370/50 |
| 4,355,405 | 10/1982 | Ruys et al. | 375/48 |

(List continued on next page.)

FOREIGN PATENT DOCUMENTS

| | | | |
|---|---|---|---|
| WO94/211049 | 9/1994 | WIPO | H09M 1/12 |
| 95/12261 | 5/1995 | WIPO | H04J 4/00 |

OTHER PUBLICATIONS

Harris Semiconductor Digital Signal Processing Databook, "Numerically Controlled Oscillator/Modulator", HSP45116, pp. 5-26/5-40, Harris Corporation.

Fundamentals of Digital Image Processing by Anil K. Jain, University of California, Davis, 1989 by Prentice-Hall, Inc., pp. 155-159, 185-187.

"Robust Digital Filter Structures", 7-3 Cascade Form Digital Filter Structures, Handbook for Digital Signal Processing by Sanjit Mitra and James Kaiser, John Wiley & Sons 1993.

Hogenauer, Eugene B. "An Economical Class of Digital Filters for Decimation and Interpolation", IEEE Transactions on Acoustics, Speech and Signal Processing, vol. ASSP-29, No. 2.

ETSI-SMG, GSM 06.31, 4.0.0, Discontinuous Transmission (DTX) for Full Rate Speech Transmission Channels, Oct. 1992.

ETSI-SMG, GSM 06.12, 4.0.1, Comfort Noise Aspects for Full Rate Speech Traffic Channels, Jan. 1993.

EIA/TIA/IS-95, Requireemnts for Base Station CDMA Operation, pp. 7-1/7-185, Appendix A Requiremetns for CDMA Service OptionsA-1/A-68.

*Primary Examiner*—Russell W. Blum

[57] ABSTRACT

A wideband frequency signal digitizer and method for digitizing multiple bands of a wideband frequency signal. The digitizer and method providing for optimally positioning a segment (402) of the wideband frequency signal within a Nyquist band of an analog-to-digital converter. Remaining segments (402) of the wideband frequency signal are closely positioned relative to the first segment such that the entire wideband frequency signal (400) is easily digitized using a single or multiple analog-to-digital converters (36) while reducing or eliminating undesirable spurious signals.

3 Claims, 3 Drawing Sheets

U.S. PATENT DOCUMENTS

| | | | |
|---|---|---|---|
| 4,492,962 | 1/1985 | Hansen | 343/369 |
| 4,514,760 | 4/1985 | Balaban et al. | 358/143 |
| 4,517,586 | 5/1985 | Balaban et al. | 358/13 |
| 4,621,337 | 11/1986 | Cates et al. | 364/727 |
| 4,652,858 | 3/1987 | Kokubo et al. | 340/347 |
| 4,783,779 | 11/1988 | Takahata et al. | 370/69.1 |
| 4,803,727 | 2/1989 | Holt et al. | 381/1 |
| 4,876,542 | 10/1989 | van Bavel et al. | 341/143 |
| 4,881,222 | 11/1989 | Goeckler et al. | 370/70 |
| 4,884,265 | 11/1989 | Schroeder et al. | 370/70 |
| 4,893,316 | 1/1990 | Janc et al. | 375/44 |
| 4,979,188 | 12/1990 | Kotzin et al. | 375/34 |
| 5,058,107 | 10/1991 | Stone et al. | 370/69.1 |
| 5,101,501 | 3/1992 | Gilhousen et al. | 455/33 |
| 5,103,459 | 4/1992 | Gilhousen et al. | 375/1 |
| 5,109,390 | 4/1992 | Gilhousen et al. | 375/1 |
| 5,136,612 | 8/1992 | Bi | 375/1 |
| 5,159,608 | 10/1992 | Falconer et al. | 375/1 |
| 5,170,413 | 12/1992 | Hess et al. | 375/38 |
| 5,187,809 | 2/1993 | Rich et al. | 455/33.1 |
| 5,224,122 | 6/1993 | Bruckert | 375/1 |
| 5,251,218 | 10/1993 | Stone et al. | 370/120 |
| 5,278,837 | 1/1994 | Kelley | 370/120 |
| 5,293,329 | 3/1994 | Wishart et al. | 364/724.13 |
| 5,295,153 | 3/1994 | Gudmundson | 375/1 |
| 5,299,192 | 3/1994 | Guo et al. | 370/70 |
| 5,313,279 | 5/1994 | Wang et al. | 348/426 |
| 5,323,157 | 6/1994 | Ledzius et al. | 341/143 |
| 5,347,284 | 9/1994 | Volpi et al. | 342/356 |
| 5,392,044 | 2/1995 | Kotzin et al. | 341/155 |
| 5,396,489 | 3/1995 | Harrison | 370/50 |
| 5,406,629 | 4/1995 | Harrison et al. | 380/34 |
| 5,412,690 | 5/1995 | Kotzin et al. | 370/70 X |

WIDEBAND FREQUENCY SIGNAL DIGITIZER AND METHOD

This is a continuation of application Ser. No. 08/366,205, filed Dec. 29, 1994 and now abandoned.

RELATED PATENT APPLICATION

The present application is related to the commonly assigned U.S. patent application Ser. No. 08/366,283, now U.S. Pat. No. 5,579,321 filed on even date herewith by Smith et al. and entitled "Split Frequency Band Signal Digitizer and Methods", the disclosure of which is hereby expressly incorporated herein by reference.

FIELD OF THE INVENTION

The present invention relates to multi-channel digital transceivers, and more particularly, to a wideband frequency signal digitizer and a method of efficiently digitizing wideband frequency signals.

BACKGROUND OF THE INVENTION

There are numerous advantages to implementing a radio communication system using digital techniques. Notably, there is enhanced system capacity, reduced noise, and reduced hardware and associated power consumption. There has been proposed several digital radio communication systems. For example, there is shown and described in the commonly assigned U.S. Patent Application entitled "Multi-Channel Digital Transceiver and Method" filed on even date herewith, the disclosure of which is hereby expressly incorporated herein by reference and of which the Applicant is a co-inventor, several preferred embodiments of radio communication systems implementing digital techniques.

Fundamental to the digital radio communication system is the requirement that the received analog radio signal be digitized. The well known Nyquist criteria provides that such digitization is accomplished with minimal error at about twice the bandwidth of the analog signal. In U.S. Pat. No. 5,251,218 a methodology typical of the prior art is disclosed for digitizing an analog radio frequency signal in accordance with this principle. It will be appreciated, however, where the radio signal occupies a large bandwidth, ADCs capable of operation at very high sampling rates are required. Such devices, to the extent they are available, are expensive and often suffer reduced performance, i.e., have significant distortion and increased power consumption when operated at high sampling rates.

The spectrum allocated to radio communication systems is typically large with respect to the requirements for digitizing. In some radio communication systems, however, although the desired signal occupies a large bandwidth, not all of the bandwidth is occupied by signals of interest. In cellular radio telephone communication systems, for example, the communication bandwidth is not contiguous. The cellular A-band, for example, is allocated a bandwidth of 12.5 megahertz (MHz). Spectrally, however, the entire A-band covers 22.5 MHz of bandwidth in two discontinuous portions. In order to digitize the A-band, one would need an ADC capable of operating, according to Nyquist criteria, at least at 45 MHz or 45 million samples per second (Ms/s), and more reliably at 56 Ms/s.

Therefore, there is a need for a device for digitizing wideband frequency band signals which is does not require high sampling rates, and does not significantly increase the amount of hardware required for the communication system.

DETAILED DESCRIPTION OF THE PREFERRED EMBODIMENTS

A wideband frequency signal digitizer and method for digitizing a wideband frequency signal provide for optimally positioning a segment of the wideband frequency signal within a Nyquist band of an analog-to-digital converter. Remaining segments of the wideband frequency signal are closely positioned relative to the first segment such that the entire wideband frequency signal is easily digitized using a single or multiple analog-to-digital converters operating at reduced sampling rates while concomitantly reducing or eliminating undesirable spurious signals from the resulting digitized signal.

The following detailed description is presented with reference to digitizer and method for efficiently and accurately digitizing the split portions of the cellular communication system A-band frequency band. It will readily appreciated by one of ordinary skill in the art, however, that the present invention has application to digitizing any wideband signal occupying continuous or discontinuous spectrum. Moreover, while the present invention is described as operating on two segments of the wideband signal, the present invention is equally applicable to a wideband frequency signal separated into a plurality of segments and processed via a plurality of signal paths.

Figure 1:
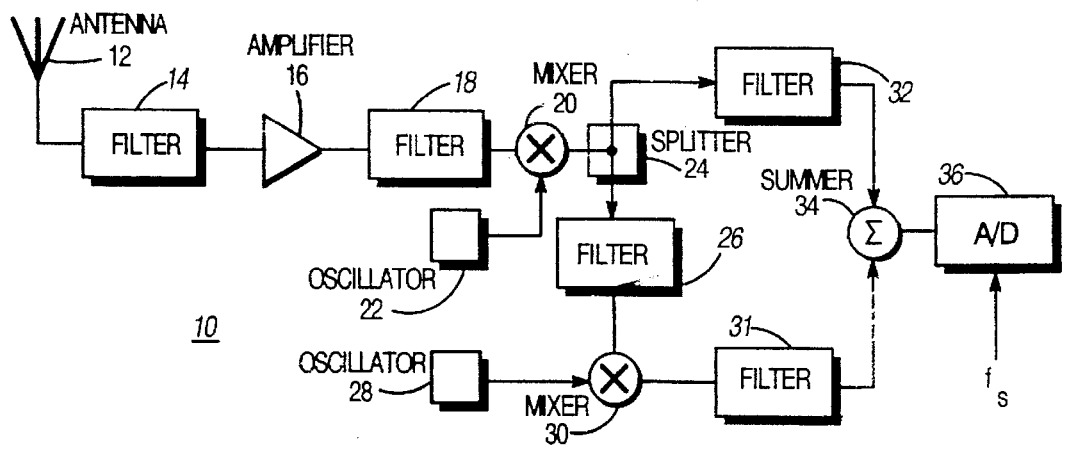
FIG. 1 is a block diagram representation of a wideband frequency signal digitizer in accordance with a preferred embodiment of the present invention.

Referring to FIG. 1, a wideband frequency signal digitizer 10 in accordance with a preferred embodiment of the present invention is shown. An analog signal is received at antenna 12 and is signal conditioned through filters 14 and 18 and amplifier 16 as is known in the art. The conditioned analog signal is communicated to mixer 20 where it is mixed with a signal from local oscillator 22. This converts, or frequency translates, the received and conditioned signal to an intermediate frequency (IF) signal.

The translated (IF) signal is then communicated to splitter 24 where the translated signal is split into a first segment and a second segment. The second segment is filtered through filter 26 and mixed with a second local oscillator 28 signal in mixer 30. The second segment is then filtered in filter 31 and communicated to summer 34. The first segment signal is filtered through filter 32 and is also communicated to summer 34. The first and second segments are summed and then digitized through analog-to-digital converter 36 at a sampling frequency $f_s$.

The operation of mixers 20 and 30 is to frequency translate the segments of the wideband frequency signal such that it can be digitized This is illustrated in and the operation of digitizer 10 described with reference to FIGS.

Figure 4A:
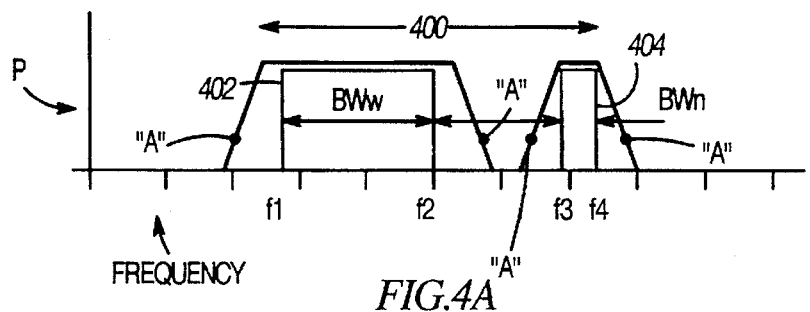
FIGS. 4A–4B spectrally illustrate the processing of a wideband frequency signal in accordance with a preferred embodiment of the present invention.
Figure 4B:
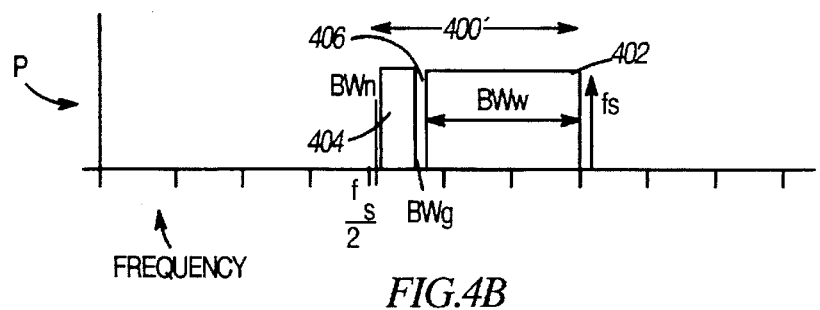

4A and 4B. The spectrum 400 illustrated in FIG. 4A is typical of the signal received at antenna 12 for the cellular A-band after processing through filters 14 and 18 and amplifier 16. The spectrum 400' illustrated in FIG. 4B represents the spectrum of FIG. 4A after processing through mixers 20 and 30. The spectrum 400' is translated to an IF frequency which is within a Nyquist band of the analog-to-digital converter. The wider portion, 402 of the spectrum 400' is positioned closely adjacent the sampling frequency $f_S$. The narrow portion 404 of spectrum 400' is split from spectrum 400' and processed as a separate segment. The result of mixer 30 is to translate the second segment 404 of the wideband frequency signal to a position nearly adjacent the first segment 402, as can be seen. The first and second segments 402 and 404 so positioned may then be digitized with a single ADC at a sampling rate slightly greater than the total bandwidth of the first and second segments. That is the minimum sampling rate:

$$f_S = 2*(BW_w + BW_n) MHz \quad (a)$$

where BWw, BWn are as shown and where a separation band BWg 406 is provided between the first and second segments 402 and 404 for filtering. The first and second segments may only be placed as closely adjacent as is possible without portions of the first and second segments falling within the transition regions of the filters.

The transition region of the analog filter is illustrated in FIG. 4A. The transition region begins at the edge of the band segment and extends to a point, "A". Point "A" represents an attenuation point which, in the preferred embodiment, is approximately 80 decibels (dB), which is defined as the "alias point", i.e., the point at which signals at frequencies falling outside of the filtered region would produce undesirable aliases in the digitized spectrum.

Figure 2:
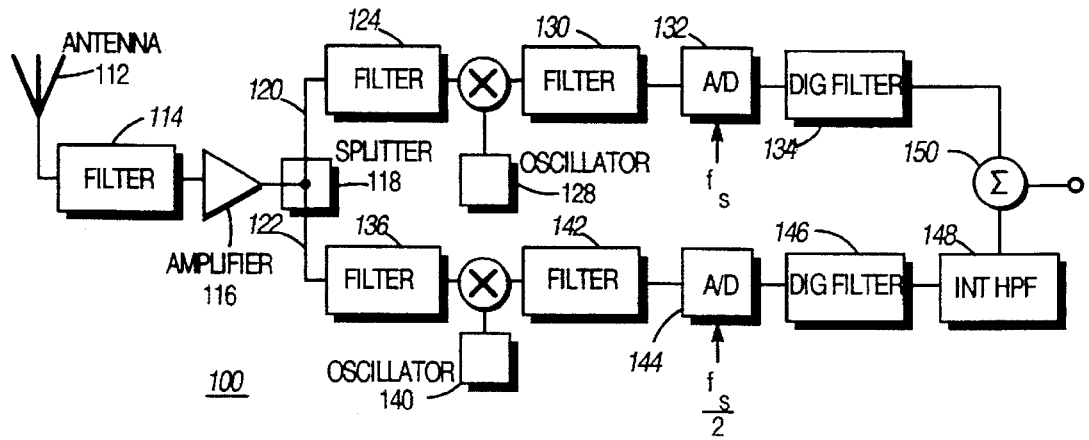
FIG. 2 is a block diagram representation of a wideband frequency signal digitizer in accordance with another preferred embodiment of the present invention.

With reference now to FIG. 2, a second embodiment of a wideband frequency digitizer 100 according to the present invention is shown. Signals are received at antenna 112 and are processed through filter 114 and amplifier 116. The signal is split in splitter 118 into first and second segments which are communicated to first and second signal paths 120 and 122, respectively. The first segment is filtered through filter 124 and is mixed with a local oscillator 128 signal in mixer 126. The mixed first segment signal is then filtered through filter 130 and is digitized in ADC 132 at a first sampling rate, $f_S$. The digitized first segment is then filtered through digital filter 134 and is communicated to summer 150.

The second segment of the signal, communicated along signal path 122, is filtered through filter 136 and mixed with a local oscillator 140 signal in mixer 138. The signal is then filtered again through filter 142 and digitized in ADC 144 at a sampling rate of $f_S/2$. The resulting digital signal is then digitally filtered through digital filter 146 and interpolated to $f_S$ and high pass filtered in interpolator/filter 148. The resulting signal is then communicated to summer 150 where it is summed with the digitized first segment of the signal yielding the entire digitized signal.

Digitizer 100 is preferable were the second segment of the signal has bandwidth smaller than the transition region and less than half the bandwidth of the first segment. This is illustrated and the operation of 100 will be described with reference to FIGS. 5A-5H. The left and right sides of FIGS. 5A-5H illustrate separately the processing of a received signal by digitizer 100 as occurs along signal paths.

Figure 5A:
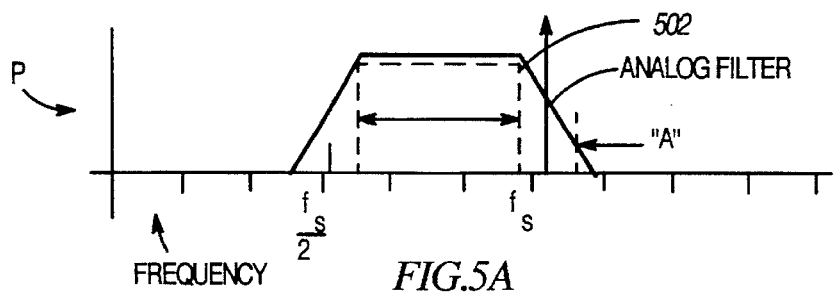
FIGS. 5A–5H spectrally illustrate the processing of a wideband frequency signal in accordance with another preferred embodiment of the present invention.
Figure 5B:
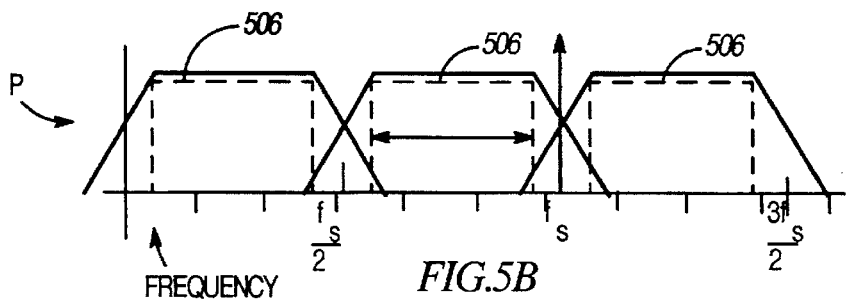
Figure 5C:
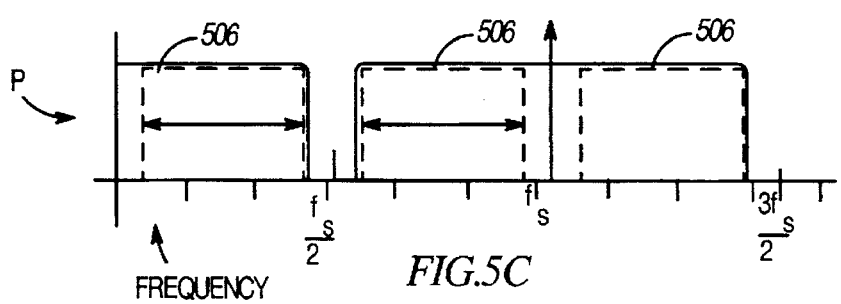
Figure 5D:
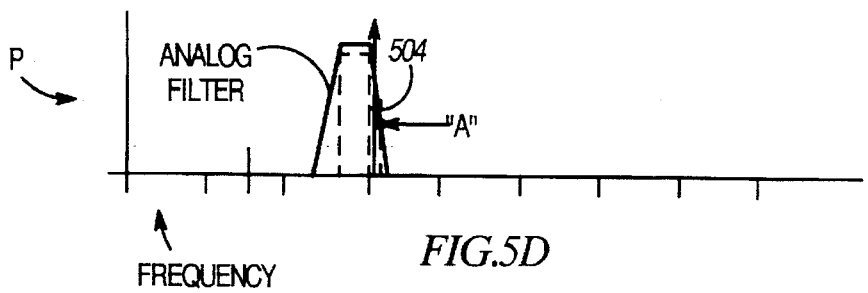
Figure 5E:
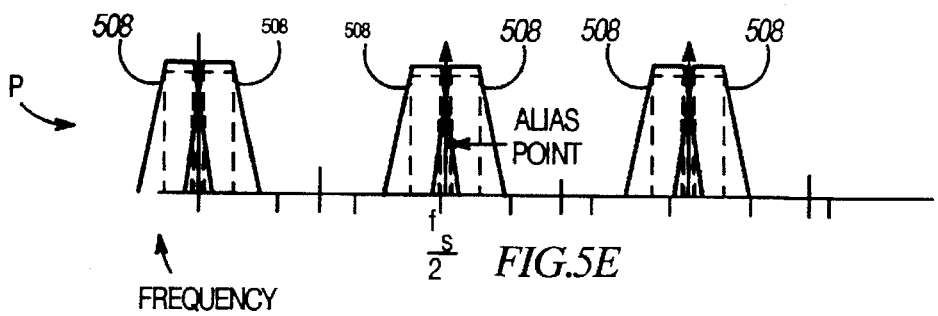

FIGS. 5A and 5D illustrate separate segments 502 and 504 of a received signal. With reference to FIG. 5A, segment 502 is the result of processing the signal along first signal path 120 through filter 130. Segment 502 is then digitized by ADC 132 at a sampling rate $f_S$ resulting in the digital signal portions 506 illustrated in FIG. 5B. Sampling rate $f_S$ is chosen as approximately 2.5 times the bandwidth of segment 502. These signal portions are then digital filtered through filter 134 as shown in FIG. 5C to remove any undesirable frequency components from the digital signals.

Figure 5F:
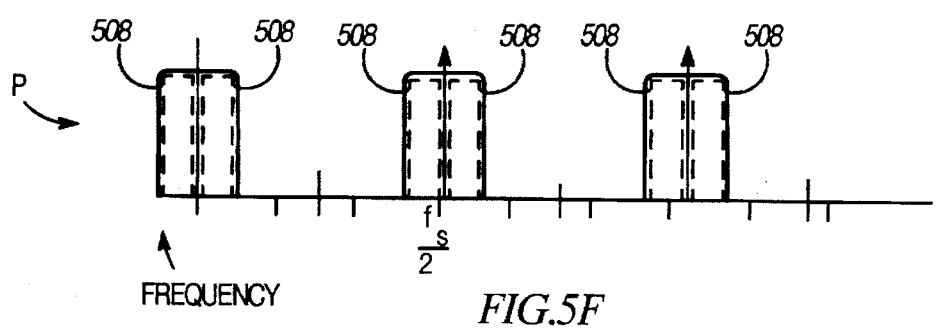
Figure 5G:
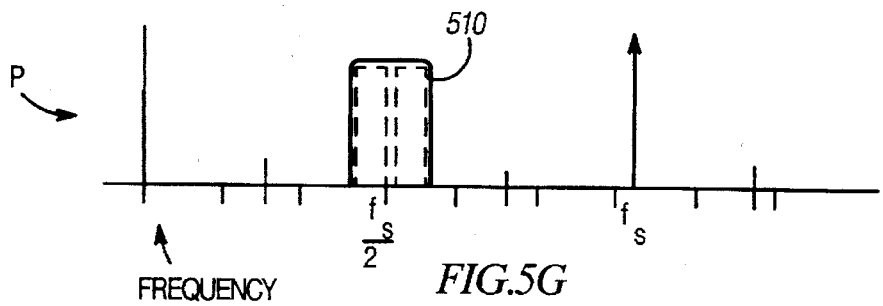
Figure 5H:
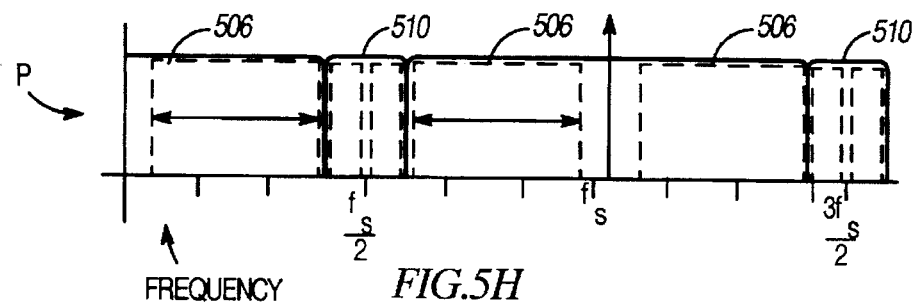

Segment 504 is the result of processing the signal along the second signal path 122 through filter 142. Segment 504 is then digitize through ADC 146 at a sampling rate of $f_S/2$ resulting in the digital signal portions 508 illustrated in FIG. 5E. The digital signal portions 508 are first digitally filtered through digital filter 146 to remove undesirable signal components. Next, the digital signal portions 508 are interpolated up to a rate of $f_S$ and digitally filtered in interpolator/filter 148 as illustrated in FIG. 5F to produce a digital signal portion 510 shown in FIG. 5G. Digital signal portion 510 is summed with digital signal portions 506 in summer 150 resulting in the digital signal spectrum shown in FIG. 5H.

The present invention advantageously combines analog filtering prior to digitizing and followed by digital filtering of split segments of a signal to be digitized. Digital filtering offers the advantage of allowing the digitized signal portions to be positioned closely adjacent spectrally for reducing sampling frequency and data rates.

Figure 3:
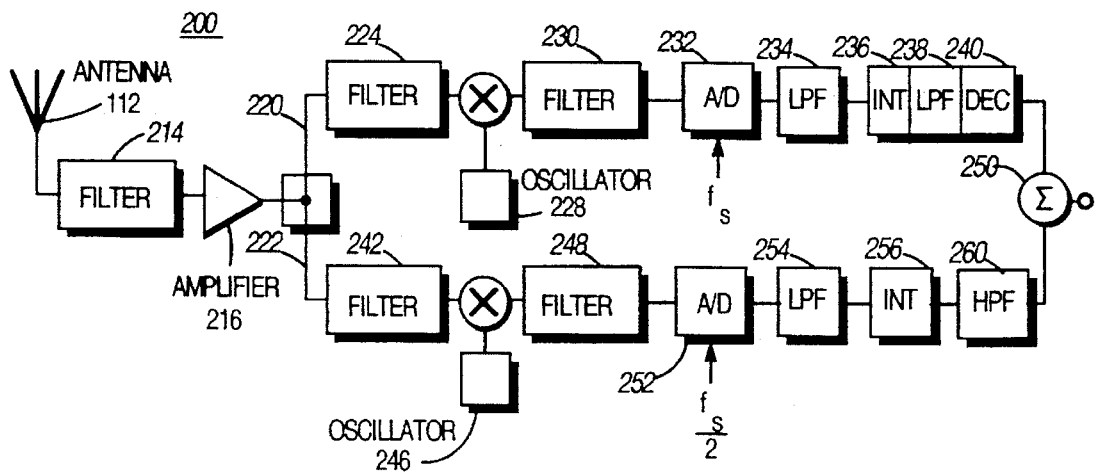
FIG. 3 is a block diagram representation of a wideband frequency signal digitizer in accordance with another preferred embodiment of the present invention.

With reference now to FIG. 3, a third embodiment of a wideband frequency digitizer 200 according to the present invention is shown. Digitizer 200 includes two signal paths 220 and 222 which are generally equivalent to those of digitizer 100 with the processing of the signal after the ADC being modified. Signals are received at antenna 212 and are processed through filter 214 and amplifier 216. The signal is split in splitter 218 into first and second segments which are communicated to the first and second signal paths 220 and 222, respectively. The first segment is filtered through filter 224 and is mixed with a local oscillator 228 signal in mixer 226. The mixed first segment signal is then filtered through filter 230 and is digitized in ADC 232 at a first sampling rate, $f_S$. The digitized first segment is then filtered through digital filter 234, interpolated by 3 in interpolator 236, low pass filtered through digital filter 238 and decimated to 1.5 $f_S$ in decimator 240 then communicated to summer 250.

The second segment of the signal, communicated along signal path 222, is filtered through filter 242 and mixed with a local oscillator 246 signal in mixer 244. The signal is then filtered again through filter 248 and digitized in ADC 252 at a sampling rate of $f_S/2$. The resulting digital signal is then low pass filtered through digital filter 254 and interpolated to 1.5 $f_S$ in interpolator 256 and high pass filtered in filter 260. The resulting signal is then communicated to summer 250 where it is summed with the digitized first segment of the signal yielding the entire digitized signal at 1.5 $f_S$.

Digitizer 200 is preferred where the second, smaller band segment is greater than the transition region but less than the half the bandwidth of the first segment. Where the second, smaller band segment is greater than the half the first band segment, digitizer 200 is modified slightly. The second signal is digitized at the sampling frequency $f_S$. As will be further appreciated, the interpolators 236 and 256 and decimator 240 are not required.

Digitizing the second segment under Nyquist criteria would suggest a sampling rate approximately 2-2.5 times the bandwidth of the second segment. However, in the present invention, the sampling rate is advantageously chosen as $f_S/2$ which is easily generated from $f_S$ and will not introduce harmonics into band. This sampling rate is chosen even where $f_S/2$ or $f_S$ is higher than is required by Nyquist criteria for the second segment. Local oscillator frequency selection is straight forward, and the frequencies are chosen such that the bands are positioned closely adjacent, spectrally, without overlap as shown in FIGS. 4A–4B and 5A–5H. Providing digital filtering simplifies isolating the band segments allowing the segments to be placed very close together.

The preferred embodiments of the present invention were presented with reference to digitizing a frequency band having two segments. It should be understood, however, that a wideband frequency where the wideband frequency can be divided into a number of segments, can be digitized in accordance with the present invention. For example, digitizer 10 is applicable where the segments can be mixed closely adjacent each other in a single Nyquist band. Digitizers 100 or 200 are applicable where the segments can not be mixed to within a single Nyquist band by combining a number of signal paths equal to the number of segments to digitize.

The foregoing invention provides for digitizing wideband segments at lower sampling frequencies otherwise required. This is accomplished without introducing undesirable clock frequencies or harmonics into band. The scope and true spirit of the invention will be readily appreciated from the foregoing discussion the subjoined claims.

What is claimed is:

1. A wideband frequency signal digitizer comprising; a plurality of signal paths comprising;
   a first signal path comprising a first filter, a mixer, a second filter, an analog-to-digital converter having a first sampling frequency and a digital filter; and
   a second signal path comprising a first filter, a mixer, a second filter, an analog to digital converter having a second sampling frequency, the second sampling frequency substantially equal to about half of the first sampling frequency, and a digital filter;
   a splitter for splitting the wideband signal into a plurality of segments corresponding to the plurality of signal paths, a first of the plurality of segments communicated to the first signal path and a second of the plurality of segments communicated to the second signal path, the second of the plurality of segments having a bandwidth less than a transition bandwidth associated with one of the first and second filters in one of the first and second signal paths which is substantially less than half the bandwidth of the first of the plurality of segments; and
   a summer in communication with each of the plurality of signal paths; wherein at least one of the plurality of signal paths further comprises an interpolator, a second digital filter and a decimator.

2. A wideband frequency signal digitizer comprising;
   a first signal path comprising a filter, a mixer, an analog to digital converter operating at a first sampling rate, and a digital filter;
   a second signal path comprising a filter, a mixer, an analog to digital converter operating at a second sampling rate, the second sampling rate equal to at most half of the first sampling rate, a digital filter, and an interpolator set at an interpolation rate that is an integer multiple of one of the sampling rates;
   a splitter routing a first segment having a first bandwidth of the wideband frequency signal to the first signal path and routing a second segment of the wideband frequency signal to the second signal path, the second segment having a bandwidth less than a transition region, of one of the filters, which is less than half of the first bandwidth; and
   a summer in communication with the first and second signal paths; wherein the first signal path further first comprises an interpolator, a second digital filter, and a decimator.

3. A method of digitizing a wideband frequency signal, the wideband frequency signal having first and second service segments, the first segment having a first bandwidth and the second segment having a second bandwidth the method comprising the steps of;
   translating the wideband frequency signal to an intermediate frequency signal, the first service segment having a first bandwidth and translated to a first intermediate frequency within a Nyquist band of an analog-to-digital converter and the second service segment having a bandwidth less than one half of the first bandwidth;
   filtering the first and second service segments;
   digitizing the first service segment at a first sampling rate;
   digitizing the second service segment at a second sampling rate substantially equal to half the first sampling rate;
   digital filtering the first and second service segments;
   interpolating at least one of the first and second service segments; and
   summing the first and second service segments, wherein a bandwidth of the second service segment is greater than a transition region, of one of the filters, and less than half the bandwidth of the first service segment, the method further comprising the steps of interpolating, filtering and decimating the first service segment.

\* \* \* \* \*